United States Patent
Siebels et al.

(10) Patent No.: US 9,169,559 B2
(45) Date of Patent: Oct. 27, 2015

(54) METHOD FOR PLASMA-TREATING WORKPIECES

(75) Inventors: Sonke Siebels, Hamburg (DE); Sebastian Kytzia, Hamburg (DE)

(73) Assignee: KHS Corpoplast GmbH, Hamburg (DE)

(*) Notice: Subject to any disclaimer, the term of this patent is extended or adjusted under 35 U.S.C. 154(b) by 246 days.

(21) Appl. No.: 13/879,943

(22) PCT Filed: Sep. 1, 2011

(86) PCT No.: PCT/DE2011/001691
§ 371 (c)(1),
(2), (4) Date: Apr. 17, 2013

(87) PCT Pub. No.: WO2012/051975
PCT Pub. Date: Apr. 26, 2012

(65) Prior Publication Data
US 2013/0202814 A1    Aug. 8, 2013

(30) Foreign Application Priority Data

Oct. 18, 2010   (DE) .......................... 10 2010 048 960

(51) Int. Cl.
| | |
|---|---|
| *C23C 16/511* | (2006.01) |
| *H05H 1/24* | (2006.01) |
| *C23C 16/02* | (2006.01) |
| *C23C 16/04* | (2006.01) |
| *C23C 16/40* | (2006.01) |
| *C23C 16/503* | (2006.01) |
| *C23C 16/515* | (2006.01) |
| *C23C 16/52* | (2006.01) |

(52) U.S. Cl.
CPC ............. *C23C 16/511* (2013.01); *C23C 16/029* (2013.01); *C23C 16/045* (2013.01); *C23C 16/047* (2013.01); *C23C 16/401* (2013.01); *C23C 16/503* (2013.01); *C23C 16/515* (2013.01); *C23C 16/52* (2013.01)

(58) Field of Classification Search
CPC .................................. C23C 16/511; H05H 1/24
See application file for complete search history.

(56) References Cited

U.S. PATENT DOCUMENTS

| | | | | |
|---|---|---|---|---|
| 5,231,057 A | * | 7/1993 | Doki et al. ..................... | 438/637 |
| 5,261,965 A | * | 11/1993 | Moslehi ............................ | 134/1 |
| 5,395,453 A | | 3/1995 | Noda | |
| 6,200,651 B1 | * | 3/2001 | Roche et al. ................... | 427/571 |
| 6,613,393 B1 | * | 9/2003 | Rauschnabel et al. ........ | 427/488 |
| 2003/0232150 A1 | * | 12/2003 | Arnold et al. ................. | 427/569 |

FOREIGN PATENT DOCUMENTS

| | | |
|---|---|---|
| DE | 0718418 A1 | 6/1996 |
| DE | 10139305 A1 | 3/2003 |
| DE | 10258678 A1 | 7/2004 |
| DE | 102004020185 A1 | 11/2005 |
| EP | 1010773 A1 | 6/2000 |
| EP | 1561840 A1 | 8/2005 |
| EP | 1630848 A1 | 3/2006 |
| EP | 1921179 A2 | 5/2008 |
| EP | 1921656 A1 | 5/2008 |
| JP | 2005290560 A | 10/2005 |
| WO | 95/22413 A1 | 8/1995 |
| WO | 99/17334 A1 | 4/1999 |
| WO | 00/58631 A1 | 10/2000 |
| WO | 01/31680 A1 | 5/2001 |
| WO | 03/014412 A1 | 2/2003 |

OTHER PUBLICATIONS

Laimer, J., et al., "Pulsed Microwave Plasma-Assisted Chemical Vapour Deposition of Diamond". Int. J. of Refractory Metals and Hard Materials 14 (1996) 179-184.*

Handy, K.G., et al., "Laser generation by pulsed 2.45-GHz microwave excitation of CO2". J. Appl. Phys. 49(7), Jul. 1978, pp. 3753-3756.*

English Translation of International Preliminary Report on Patentability dated May 2, 2013 in corresponding International Application No. PCT/DE2011/001691, Filed Sep. 1, 2011.

* cited by examiner

*Primary Examiner* — Bret Chen
(74) *Attorney, Agent, or Firm* — Rankin, Hill & Clark LLP

(57) ABSTRACT

A method for the plasma treatment of a workpiece that includes inserting the workpiece into a plasma chamber and depositing, with the effect of a partial vacuum after plasma ignition, a coating on the workpiece by plasma treatment. Plasma ignition occurs by pulsed microwave energy, and alternating "on" phase times and "off" phase times from pulsed microwave excitation are provided by a control. During a beginning portion of the plasma treatment, a first portion of the coating is deposited. Subsequently, a quotient of the "on" phase times and the "off" phase times is increased to deposit a second portion of the coating, which has a different composition than the first portion of the coating. The quotient of the "on" phase times and the "off" phase times is then decreased to form a third portion of the coating, which has a different composition than the second portion of the coating.

10 Claims, 8 Drawing Sheets

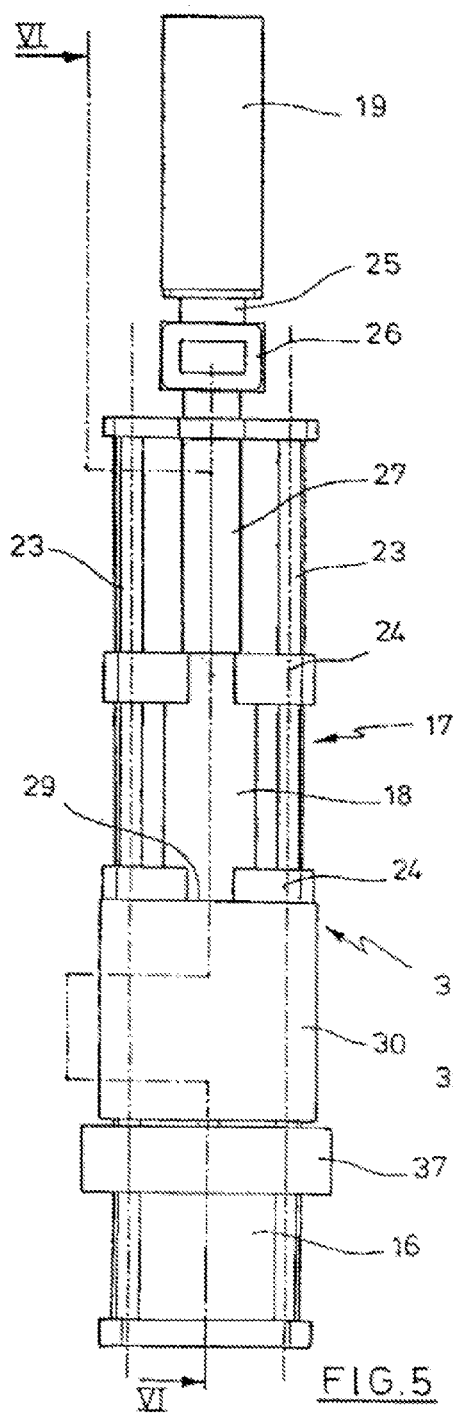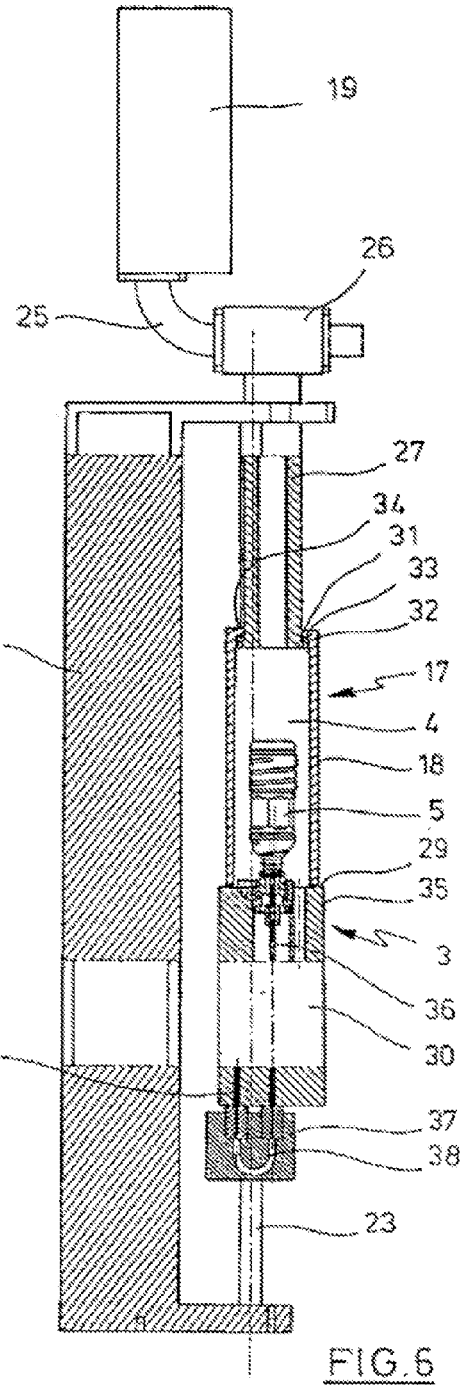

METHOD FOR PLASMA-TREATING WORKPIECES

Figure 1:
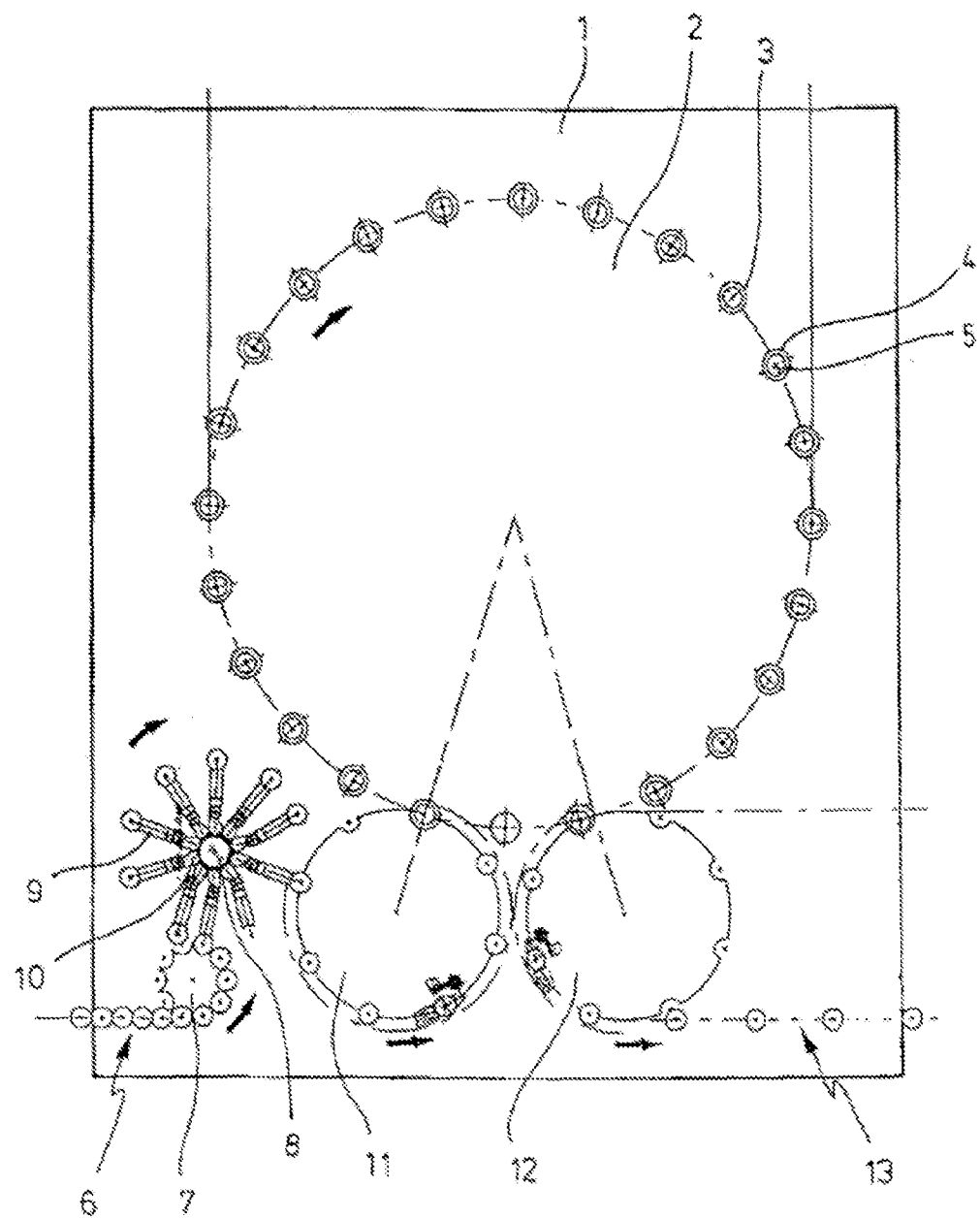

The invention concerns a method for plasma treatment of workpieces, in which the workpiece is inserted into a plasma chamber and in which a coating is then deposited on the workpiece by effecting a partial vacuum after igniting a plasma, and in which plasma ignition occurs by means of pulsed microwave energy, whereby alternating the "on" and "off" phases of a microwave energy excitation are provided by a control.

The invention in addition concerns a device for plasma treatment of workpieces, which exhibits at least one evacuatable plasma chamber for receiving the workpieces and in which the plasma chamber is disposed in the region of a treatment station, and in which the plasma chamber is bounded by a chamber floor, a chamber cover, and a lateral chamber wall and in which the plasma chamber is connected to a mechanism for igniting the plasma by means of pulsed microwave energy, for which a control mechanism is constructed for controlling the excitation of the microwave energy for alternating generation of "on" and "off" phases of the microwave excitation.

Such methods and devices are used, for example, to provide plastics with surface coatings. In particular, such devices are also known for coating the inner or outer surfaces of containers that are provided for packaging liquids. In addition, mechanisms are known for plasma sterilization.

A plasma chamber is described in PCT/WO95/22413 for coating the inside of bottles made of PET. The bottles to be coated are lifted by means of a movable floor into a plasma chamber and are brought into contact with a fitting in the mouth area of a bottle.

Evacuation of the inside of the bottle can occur by means of the fitting. In addition, a hollow gas lance is inserted by means of the fitting into the inside of the bottle to supply process gas. Plasma ignition occurs using microwaves.

It is already known from this publication to arrange a plurality of plasma chambers on a rotating wheel. This aids in a high rate of production of bottles per unit time.

A supply mechanism is discussed in EP-OS 10 10 773 for evacuating the inside of a bottle and for supplying process gas. A plasma chamber is described in PCT/WO01/31680 in which the bottles are guided by a movable cover which was previously connected to the mouth area of the bottles.

PCT/WO00/58631 likewise already shows the arrangement of plasma stations on a rotating wheel and describes for such an arrangement the grouped coordination of vacuum pumps and plasma stations, to aid favorable evacuation of the chambers as well as of the inside of the bottles. In addition, the coating of a plurality of containers at a common plasma station or a common cavity is mentioned.

A further arrangement for accomplishing the internal coating of bottles is described in PCT/WO99/17334. In particular, an arrangement is described here for a microwave generator above the plasma chamber, as well as vacuum and feed machinery through a floor of a plasma chamber.

In DE 10 2004 020 185 A1, a gas lance has already been described which can be inserted into the inside of a preform to be coated and serves to feed the process gases.

The gas lance is positionable in the longitudinal direction of the container.

With the predominant number of the known devices for improving the barrier properties of thermoplastic material, plasma-produced coatings are used made out of silicon oxides with the general chemical formula SiOx. Such barrier coatings prevent the penetration of oxygen into the packaged liquids, as well as the escape of carbon dioxide with $CO_2$-bearing liquids.

In WO 03/014412 A1, the execution of a plasma coating process is described, in which the required energy input occurs by means of pulsed microwave energy. For the general execution of the coating process, a suitable pulse width and pulse height are selected for the microwave energy. Pause times between the individual impulses are likewise set and are held constant for the duration of the coating. According to this, in executing the coating process, prior art varies the volume stream for the process gases supplied as well as the mix of process gases. Typically, the mixture ratios and/or the respective volume streams of process gases are switched at specified times, so that a multi-layered buildup results. When applying barrier coatings made of SiOx onto a substrate made of plastic, typically two layers are generated, namely a bonding layer and the barrier layer proper. Depending on the application, an additional protective layer can even be disposed on the barrier layer.

The required variation in volume streams or, to be precise, the compositions of the process gases, demands comparatively complex valve control. In addition, corresponding control operations do not lead immediately to an effect on the process because, due to existing cable lengths and amounts of gas remaining in the valve area, delays are to be taken into consideration.

Hence the task of the present invention is to improve a method of the type cited in the beginning, so that simple, and at the same time rapid, process control is supported.

This problem is solved according to the invention in that, while carrying out the treatment process for a workpiece, the relationship between the duration of the "on" phases and the duration of the "off" phases is varied.

A further task of the present invention is to make a device available of the type cited in the beginning, such that simple, and at the same time rapid, process control is achieved.

This problem is solved according to the invention in that the control mechanisms while performing the treatment process for a workpiece alters the relationship between the duration of the "on" phases and the duration of the "off" phases.

By means of the opportunity to change the temporal relationship between the "on" phases and the "off" phases of the pulsed microwave energy, an additional possibility is made available for influencing the coating process. In particular, it is possible to accomplish maximum effective control without changing the composition of process gases and/or the volume streams of the process gases supplied or at least with a reduced effect on the process. According to the invention, it will be seen, particularly by changing the energy introduced in a temporal manner, that the deposition behavior of the process gases can be significantly altered. For example, it is shown that with a small average energy input, and consequently with a comparatively short "on" phase for the microwave energy, an elevated amount of carbon is deposited. When using process gases which contain silicon, oxygen, and carbon, the deposition of SiOx rises with increasing intensity of the energy input, and thereupon the proportion of carbon in the deposited layer diminishes. Similar effects are also shown with other, different compositions for the process gases.

A targeted effect of chemical and physical properties of the layer deposited during plasma treatment can occur such that, while executing the plasma treatment, the quotient of the duration of the "on" and "off" times is increased.

To ensure the supply of a sufficient amount of process gases, it is proposed that the duration of an "off" time between two "on" times is held constant, at least during part of the time of plasma treatment.

A typical execution method is defined in that the "off" time is approximately 30 milliseconds.

In addition, it is intended therewith that the "on" time for the beginning of a plasma treatment be approximately 0.3 milliseconds.

It has likewise proved to be appropriate for the "on" time at the end of a plasma treatment to be approximately 0.3 milliseconds.

Continually changing parameters throughout the layer thickness is achieved by continuously increasing the "on" time during the period of the treatment process.

According to a preferred embodiment, it is therewith intended that a bottle-shaped container as a workpiece be provided with a barrier layer.

An effect of the bonding properties and/or the chemical resistance to the effects of acidic or alkaline media is achieved as a result of the barrier layer being provided with a variable proportion of carbon throughout the layer thickness.

A transparent barrier layer with good barrier properties is made available as a result of a layer that contains SiOx being used as a barrier layer.

Making both a bonding available and a protective layer is aided as a result of a proportion of carbon in the barrier layer coming from the workpiece being first reduced throughout the layer thickness and being again increased in an area away from the workpiece.

With respect to control engineering, the generation of both a bonding layer and a protective layer is achieved in that the quotient of the "on" time and the "off" time during the period of the treatment process is first increased and then reduced again.

The method according to the invention as well as the device according to the invention are suited for controlling the work cycle of a coating procedure for bottles made of plastic. In particular, a inner coating with a layer of coating SiOx thereby results for these bottles, in which the bonding of the layer made of SiOx to the plastic can be improved by means of an interlayer, which is constructed as an bonding promoter. The coating procedure is preferably performed as a plasma impulse-induced chemical vapor deposition (PICVD) process. In such a procedure, the plasma is ignited by using microwave pulses. The pulses can be controlled with respect to their pulse width, pulse distance, and pulse height.

Figure 2:
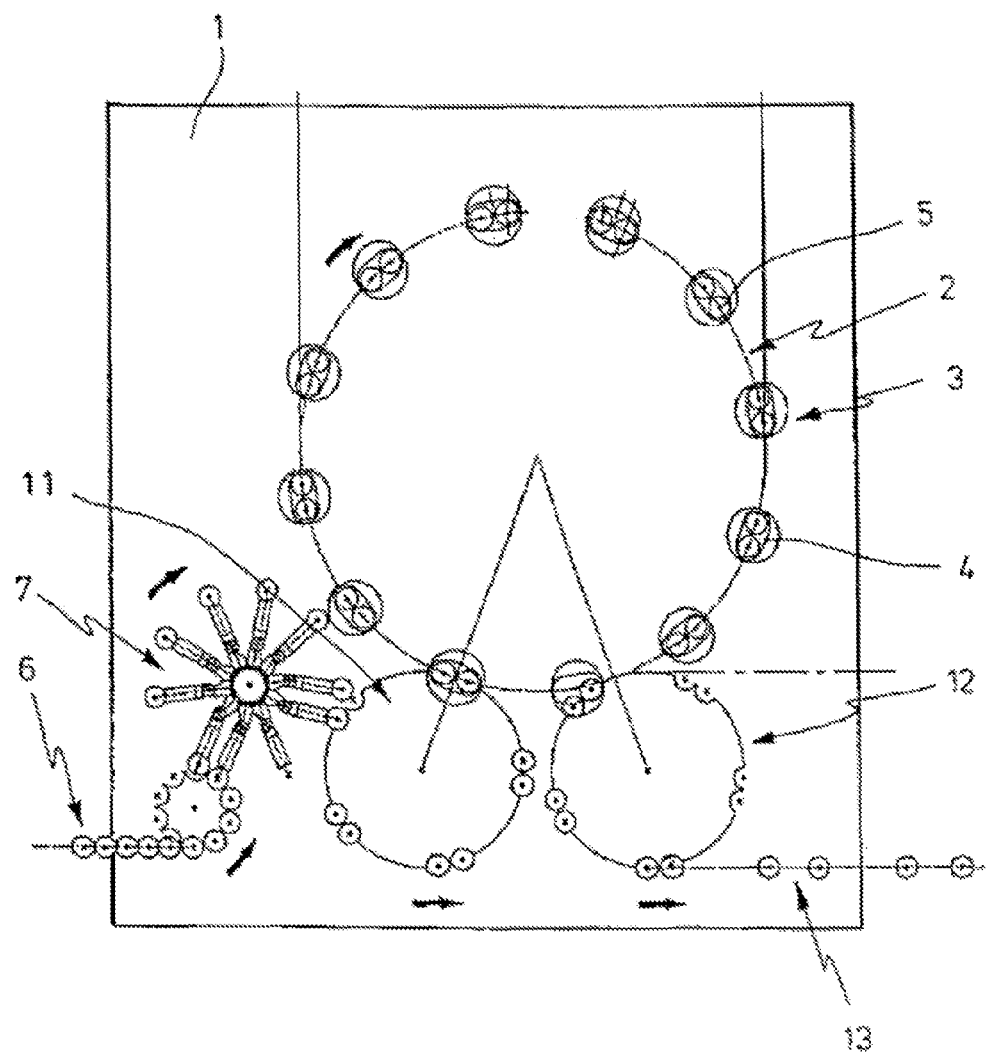
Figure 3:
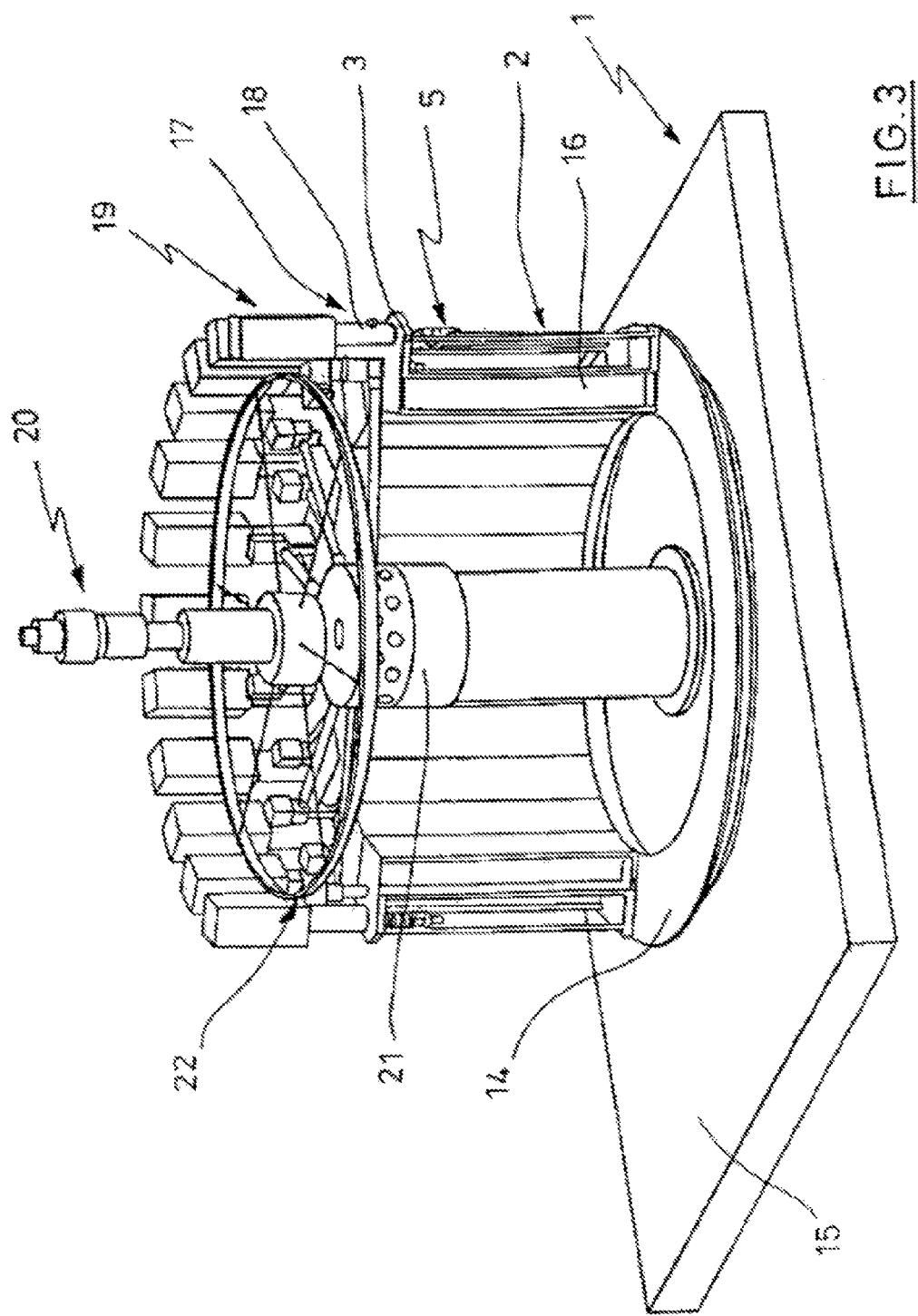
Figure 4:
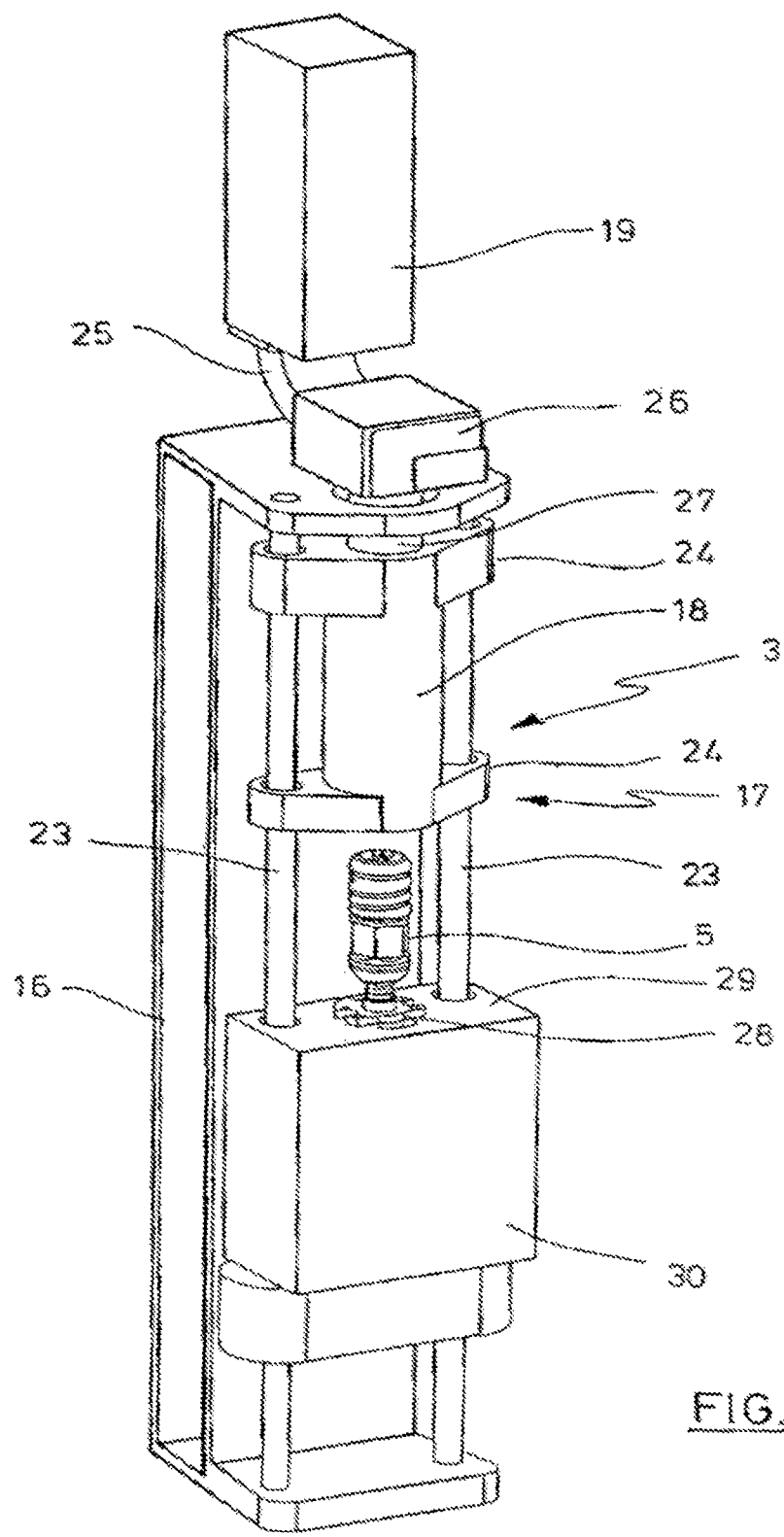
Figure 7:
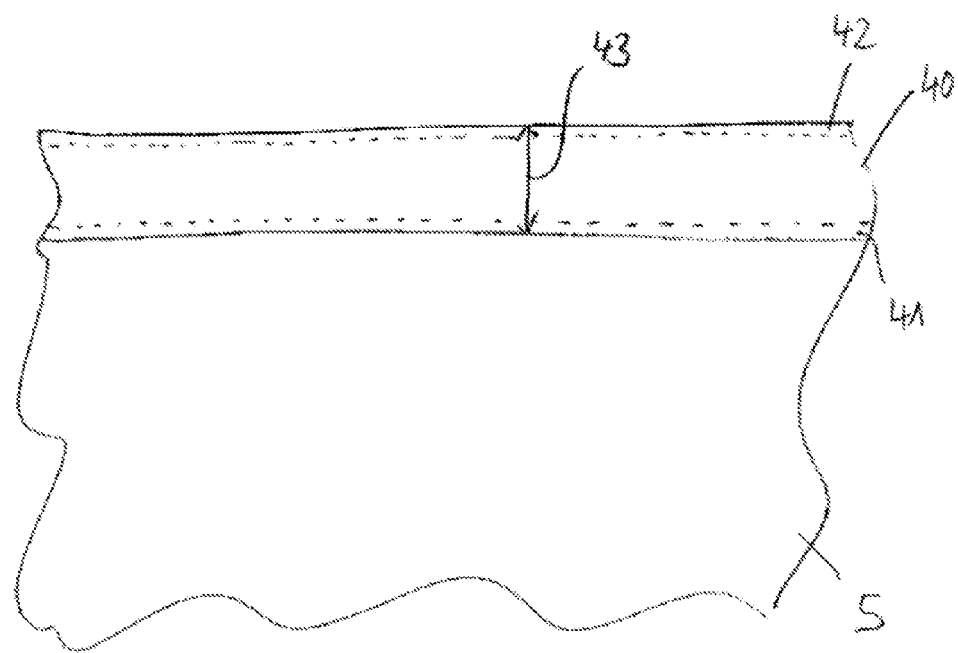
Figure 8:
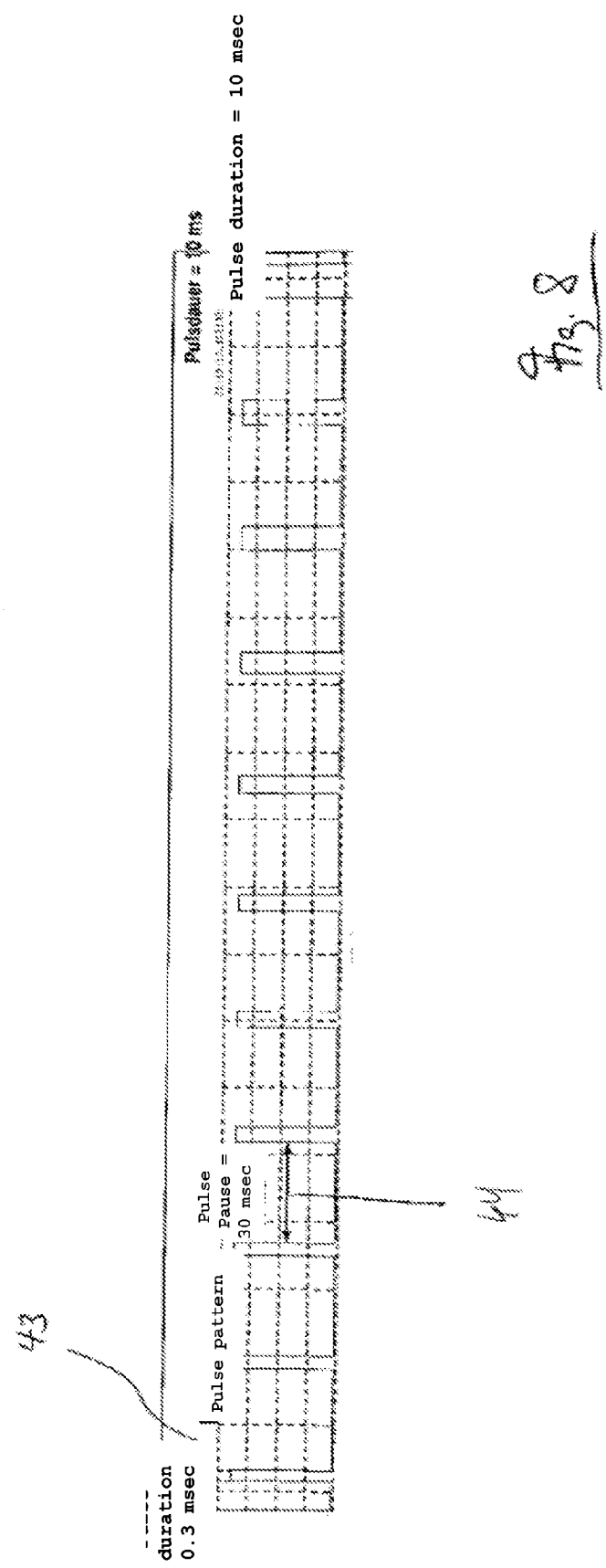
Figure 9:
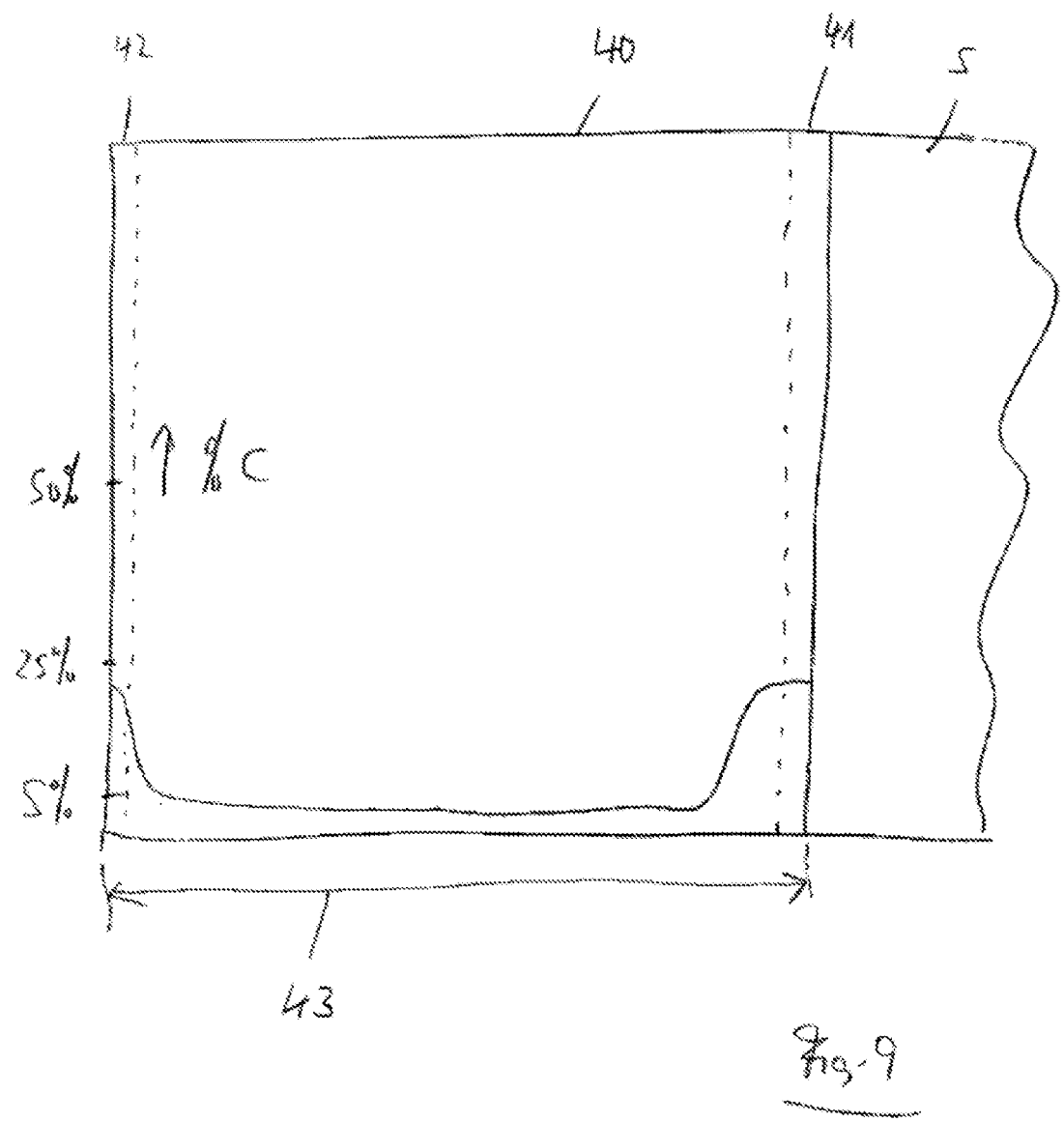

The invention is schematically represented in the drawings by way of an embodiment example. They show:

FIG. 1 a sketch of the principle of a plurality of plasma chambers, which are disposed on a rotating plasma gear and in which the plasma gear is coupled to input and output gears, FIG. 2 an arrangement similar to that in FIG. 1, in which the plasma stations are each provided with two plasma chambers, FIG. 3 a perspective representation of a plasma gear with a plurality of plasma chambers, FIG. 4 a perspective representation of a plasma station with one cavity, FIG. 5 a front view of the device according to FIG. 4 with a closed plasma chamber, FIG. 6 a cross-section along the line VI-VI in FIG. 5, FIG. 7 a partial representation of a cross-section through a substrate with a barrier layer, FIG. 8 a chart for illustrating different pulse widths of a pulsed feed of microwave energy, and FIG. 9 a highly magnified cross-section through a barrier layer with variable carbon content throughout the coating thickness.

A plasma module (1) may be seen from the illustration in FIG. 1, which is provided with a rotating plasma gear (2). Disposed along the circumference of the plasma wheel (2) is a plurality of plasma stations (3). The plasma stations (3) are provided with cavities (4) or plasma chambers (17) to receive workpieces (5) to be treated.

The workpieces (5) to be treated are fed to the plasma module (1) in the input area (6) and are passed on by a separation gear (7) to a transfer wheel (8), which is provided with positionable support arms (9). The support arms (9) are pivotably disposed relative to a base (10) of the transfer wheel (8) so that variation in the distance of the workpieces (5) from one another can be accomplished. Transfer of the workpieces (5) thereby occurs from the transfer wheel (8) to an input gear (11) with the distance of the workpieces (5) from one another increased relative to the separation gear (7). The input gear (11) transfers the workpieces (5) to be treated to the plasma gear (2). After carrying out the treatment, the treated workpiece (5) is removed by an output gear (12) from the area of the plasma gear (2) and is transferred into the area of a output path {13).

With the embodiment according to FIG. 2, the plasma stations (3) are each provided with two cavities (4) or plasma chambers (17). Two workpieces (5) respectively can thereby be treated at the same time. It is hereby basically possible to construct the cavities (4) completely separate from one another, but it is also basically possible to simply separate subareas from one another in a common cavity space, such that an optimal coating is ensured for all workpieces (5). In particular, it is hereby intended therewith that the subcavities be separated from one another at least by separate microwave excitations.

FIG. 3 shows a perspective representation of a plasma module (1) with a partially constructed plasma gear (2). The plasma stations (3) are disposed on a support ring (14), which is constructed as a part of a rotary connection and is positioned in the area of a machine base (15). The plasma stations (3) each exhibit a station frame (16), which contains the plasma chambers (17). The plasma chambers (17) exhibit cylinder-shaped chamber sides (18) as well as microwave generators (19).

Disposed in the center of the plasma gear (2) is a rotary distributor (20), by means of which the plasma stations (3) are provided with operating resources as well as power. Ring conduits (21), in particular, can be used for distribution for the operating resources.

The workpieces (5) to be treated are depicted below the cylinder-shaped chamber sides (18). The lower parts of the plasma chambers (17) are not drawn in, for simplicity's sake.

FIG. 4 shows a plasma station (3) in perspective representation. It may be seen that the station frame (16) is provided with guide rods (23), on which is a sliding carriage (24) to hold the cylinder-shaped chamber side (18). FIG. 4 shows the sliding carriage (24) with chamber side (18) in a raised state, so that the workpiece (5) is released.

Disposed in the upper area of the plasma station (3) is the microwave generator (19). The microwave generator (19) is connected by means of a linkage (25) and a fitting (26) to a coupling duct (27), which enters the plasma chamber (17). Basically, the microwave generator (19) can be attached, both directly in the area of the chamber cover (31) and by means of a distancing element on the chamber cover (31), at a distance that can be set for the chamber cover (31), and consequently it is disposed in a larger circumferential area of the chamber cover (31). The fitting (26) has the function of a transition element, and the coupling duct (27) is constructed as a coaxial conduit. Disposed in an entrance area of the coupling duct (27) into the chamber cover (31) is a quartz-glass window. The linkage (25) is constructed as a wave guide.

The workpiece (5) is positioned by a mounting element (28) which is disposed in the area of the chamber floor (29). The chamber floor (29) is constructed as part of a chamber base (30). To facilitate adjustment, it is possible to fasten the chamber base (30) in the area of the guide rods (23). Another variant exists in that the chamber base (30) is fastened directly to the station frame (16). With such an arrangement, it is also possible, for example, for the guide rods (23) to be executed in two parts in a vertical direction.

FIG. 5 shows a front view of the plasma station (3) according to FIG. 3 in the closed state of the plasma chamber (17). The sliding carriage (24) with the cylinder-shaped chamber side (18) is thereby lowered from the position in FIG. 4, so that the chamber side (18) is driven against the chamber floor (29). The plasma coating can be performed in this positional state.

FIG. 6 shows in vertical-section representation the arrangement according to FIG. 5. It may be seen, in particular, that the coupling duct (27) enters into a chamber cover (31), which exhibits a flange (32) projecting laterally. Disposed in the area of the flange (32) is a gasket (33), which faces forward from an internal flange (34) of the chamber side (18). In the lowered state of the chamber side (18), sealing occurs herewith of the chamber side (18) relative to the chamber cover (31). A further gasket (35) is disposed in an internal area of the chamber side (18) to ensure sealing here relative to the chamber floor (29).

In the position depicted in FIG. 6, the chamber side (18) surrounds the cavity (4), so that both the inside of the cavity (4) and the inside of the workpiece (5) can be evacuated. To support feed of process gas, a hollow gas lance (36) is disposed in the area of the chamber base (30), which can be conveyed into the inside space of the workpiece (5). To position the gas lance (36), it is held by a lance carriage (37) which is positionable along the guide rods (23). Inside the lance carriage (37) runs a process-gas channel (38), which in the raised position depicted in FIG. 6 is coupled to a gas connection (39) of the chamber base (30). By means of this arrangement, hose-like connection elements are avoided to the lance carriage (37).

Alternatively, for the previously discussed construction of the plasma station, it is also possible according to the invention to guide the workpiece (5) into a plasma chamber (17) that is immobile relative to the related support structure. Likewise, it is possible, alternatively to the coating of the workpiece (5) depicted with its openings perpendicular downward, to execute coating of the workpiece with its openings perpendicular upward. In particular, it is intended therewith to execute a coating of a bottle-shaped workpiece (5). Such bottles are likewise preferred to be made of a thermoplastic material. Preferably, the use of PET or PP is intended. According to a further preferred embodiment, the coated bottles serve to receive beverages.

A typical treatment process is explained in the following as an example of a coating process and accomplished such that first the workpiece (5) is transported to the plasma gear (2) using an input gear (11) and that in a raised state of the capsule-like chamber side (18), the insertion of the workpiece (5) into the plasma station (3) occurs. After completing the insertion process, the chamber side (18) is lowered into its sealed position and an evacuation of both the cavity (4) and the inside of the workpiece (5} is simultaneously performed first.

After a sufficient evacuation of the inside of the cavity (4), the lance (36) is run into the inside of the workpiece (5) and by moving the mounting element (28), sealing of the inside of the workpiece (5) rather than the inside of the cavity (4) is performed. It is likewise possible to convey the gas lance (36) into the workpiece (5), synchronously with the beginning of evacuating the inside of the cavity. The pressure on the inside of the workpiece (5) is then reduced even further. In addition, it is also intended therewith to carry out the positioning movement of the gas lance (36), already at least partially parallel to the position of the chamber side (18). After attaining a sufficiently low pressure, the process gas is conducted into the inside of the workpiece (5) and the plasma is ignited with the aid of the microwave generator (19). In particular, it is intended therewith to deposit, with the aid of the plasma, both a bonding promoter onto an inner surface of the workpiece (5) and the barrier layer proper, made of silicon oxides.

After completing the treatment process, the gas lance (36) is again removed from the inside of the workpiece (5) and both the plasma chamber (17) and the inside of the workpiece (5) are ventilated. After reaching ambient pressure inside the cavity (4), the chamber side (18) is again raised in order to remove the coated workpiece (5) and to insert a new workpiece (5) to be coated.

Positioning the chamber side (18), the sealing element (28), and/or the gas lance (36) can occur using different drive units. Basically, the use of pneumatic drives and/or electrical drives is conceivable, particularly in an embodiment as a linear motor. In particular, it is intended therewith to aid precise coordination of movement with a rotation of the plasma gear (2) to affect curve control. Curve control can, for instance, be carried out such that, disposed along the circumference of the plasma gear (2), are control curves along which guide rollers are guided. The guide rollers are coupled respectively to the structural elements to be positioned.

FIG. 7 shows a partial representation of a magnified cross-section through a workpiece (5), which is provided with a barrier layer (40). Typically, the barrier layer (40) is disposed on one side of a bottle-shaped container. In particular, the workpiece (5) is made of PET. Preferably, the barrier layer (40) is joined by means of a bonding layer (41) to the workpiece (5). In addition, it is possible to provide the barrier layer (40) in the area of its spread away from the workpiece (5) with a protective layer (42).

Basically, the bonding layer (41) and/or the protective layer (42) are constructed as layers separated by the barrier layer (40). In particular, it is intended therewith to implement so-called gradient layers, in which a layer-like action is achieved by varying the elementary composition throughout the layer thickness (43). As a result, so-called gradient layers are made available. At least one of the chemical elements carbon, silicon, and oxygen is involved in varying the elementary composition. Basically, other chemical elements could also be used, additionally or alternatively.

FIG. 8 illustrates a time path for a pulsed microwave feed to ignite the plasma. During the period of coating the workpiece (5) and consequently during the period of building up the barrier layer (40), the ratio here between the "on" times (43) of microwave energy and the "off" times (44) of microwave energy is varied. The embodiment example represented shows a change such that with constant "off" times (44), the duration of the "on" times (43) is varied. It is thereby intended that the "off" time (44) preferably be 30 milliseconds. A range that can be implemented lies between 10 milliseconds and 100 milliseconds, preferably between 20 milliseconds and 40 milliseconds.

An "on" time executed at the beginning of the process is approximately 0.3 milliseconds in the embodiment. The "on" time at the end of the process is approximately 10 milliseconds. Consequently, the "on" time (43) increases to approximately 30-times longer over the duration of the process.

In particular, it is intended therewith to continuously increase the "on" time (43) during the period of the treatment process. Application of the "on" time (43) over the period of the process consequently leads to a step-like path.

A typical pulse microwave output is approximately 1500 watts. A typical process pressure lies between 0.2 and 0.5 mbar. HMDSN is preferably used as the process gas. Its typical gas flow lies in the range of 5-10 sccm per double reactor in the coating phase. Oxygen can be supplied as the oxidizing gas. A typical flow here is in the range of 300-800 sccm. An average microwave output for the beginning of the process lies in the range of 20-100 watts and in the range of 200-600 watts for the end of the process.

FIG. 9 shows a further magnified, partial cross-section through a workpiece (5) with a barrier layer (40). Additionally, a path for carbon concentration through the layer thickness (43) is plotted in element percentage.

FIG. 9 shows in particular a one-layer buildup on the substrate (5). The functional properties of the bonding layer (41) and/or the protective layer (42) are readily attained by changing the elementary composition within this one-layer coat. Typically, the proportion of carbon in element percent lies in the range of the functional bonding layer (41) and/or the functional protective coat (42) is in the range of 10-30 percent. A value of approximately 20 percent is preferred. The proportion of carbon in the range of the functional barrier properties is approximately 5 element percent.

The invention claimed is:

1. A method for the plasma treatment of a workpiece, the method comprising the steps of:
   inserting the workpiece into a plasma chamber; and
   depositing, with the effect of a partial vacuum after plasma ignition, a coating on the workpiece by plasma treatment;
   wherein plasma ignition occurs by means of pulsed microwave energy,
   wherein alternating "on" phase times and "off" phase times from pulsed microwave excitation are provided by a control,
   wherein, during a beginning portion of the plasma treatment, a first portion of the coating is deposited,
   wherein, subsequent to the beginning portion of the plasma treatment, a quotient of the "on" phase times and the "off" phase times is increased to deposit a second portion of the coating that has a composition that is different than the first portion of the coating, and
   wherein, the quotient of the "on" phase times and the "off" phase times is decreased after deposition of the second portion of the coating to form a third portion of the coating that has a composition that is different than the second portion of the coating.

2. The method according to claim 1, wherein, at least during a part of the plasma treatment, a duration of the "off" phase times is held constant.

3. The method according to claim 1, wherein the "off" phase times are approximately 30 milliseconds.

4. The method according to claim 1, wherein the "on" phase times during the beginning portion of the plasma treatment is approximately 0.3 milliseconds.

5. The method according to claim 1, wherein the "on" phase times during formation of the third portion of the coating are approximately 0.3 milliseconds.

6. The method according to claim 1, wherein the "on" phase times are continuously increased during the plasma treatment.

7. The method according to claim 1, wherein the workpiece is a bottle-shaped container, and the coating comprises a barrier layer.

8. The method according to claim 1, wherein the coating is provided throughout its thickness with a variable proportion of carbon.

9. The method according to claim 7, wherein the barrier layer contains SiOx.

10. The method according to claim 1, wherein the coating comprises a bonding layer disposed on the workpiece, a protective layer and a barrier layer disposed intermediate the bonding layer and the protective layer, wherein a proportion of carbon in the barrier layer is lower than in the bonding layer, and wherein a proportion of carbon in the protective layer is higher than in the barrier layer.

* * * * *